(12) United States Patent
Chi et al.

(10) Patent No.: US 6,943,391 B2
(45) Date of Patent: Sep. 13, 2005

(54) MODIFICATION OF CARRIER MOBILITY IN A SEMICONDUCTOR DEVICE

(75) Inventors: Min-Hwa Chi, Hsin-Chu (TW); Wai-Yi Lien, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 13 days.

(21) Appl. No.: 10/718,920

(22) Filed: Nov. 21, 2003

(65) Prior Publication Data

US 2005/0110039 A1    May 26, 2005

(51) Int. Cl.[7] .............................................. H01L 27/20
(52) U.S. Cl. ...................... 257/254; 257/18; 257/19; 257/108; 257/222; 257/417; 257/418; 257/747; 438/50; 438/51; 438/52; 438/53
(58) Field of Search ............................ 257/18, 19, 108, 257/178, 179, 222, 225, 254, 417–419, 746–748

(56) References Cited

U.S. PATENT DOCUMENTS 5,471,073 A * 11/1995 Kohno ........................ 257/108
2003/0162348 A1   8/2003 Yeo et al.

OTHER PUBLICATIONS

Rim, K., et al., "Fabrication and Analysis of Deep Submicron Strained-Si N-MOSFET's," IEEE Transactions on Electron Devices, vol. 47, No. 7, pp. 1406-1415, Jul. 2000.
Rim, K., "Strained Si Surface Channel MOSFETS for High-Performance CMOS Technology," IEEE International Solid-State Circuits Conference, paper #7.3, pp. 116-117, 2001.
Yeo, Y.C., et al., "Enhanced performance in Sub-100 nm CMOSFETs using Strained Epitaxial Silicon-Germanium," International Electron Device Mettings, pp. 753-756, 2000.
Ootsuka, F., et al., "A Highly Dense, High-Performance 130nm Node CMOS Technology for Large Scale System-on-a-Chip Applications," International Electron Device Meetings, pp. 575-578, 2000.
Ito, S., et al., "Mechanical Stress Effect of Etch-Stop Nitride and Its Impact on Deep Submicron Transistor Design," International Electron Device Meetings, pp. 247-250, 2000.
Shimizu, A., et al., "Local Mechanical-Stress Control (LMC): A New Technique for CMOS-Performance Enhancement," International Electron Device Meetings, pp. 433-436, 2001.
Ota, K., et al., "Novel Locally Strained Channel Technique for High Performance 55nm CMOS," International Electron Device Meetings, pp. 27-30, 2002.
Scott, G., et al., "NMOS Drive Current Reduction Caused by Transistor Layout and Trench Isolation Induced Stress," International Electron Device Meetings, pp. 827-830, 1999.
Bianchi, R.A., et al., "Accurate Modeling of Trench Isolation Induced Mechanical Stress Effects on MOSFET Electrical Performance," International Electron Device Meetings, pp. 117-120, 2002.

* cited by examiner

*Primary Examiner*—Andy Huynh
(74) *Attorney, Agent, or Firm*—Slater & Matsil, L.L.P.

(57) ABSTRACT

Tensile or compressive stress may be added in one or more selected locations to the biaxial residual stress existing in the channel of a semiconductor device, such as a MOSFET. The periphery of the active area containing the channel is modified by following layout procedures that result in forming outward protrusions of or inward depressions in the periphery of the active area and its surrounding shallow trench isolation during generally otherwise conventional fabrication of the device.

32 Claims, 7 Drawing Sheets

MODIFICATION OF CARRIER MOBILITY IN A SEMICONDUCTOR DEVICE

TECHNICAL FIELD

The present invention generally relates to the enhancement or reduction of carrier mobility in a semiconductor device. More particularly, the present invention relates to an improved strained channel semiconductor device in which electron and hole mobility in a channel are selectively modified, and a method of forming thereof.

BACKGROUND

FIGS. 1 and 2 are, respectively, two generalized, simplified top and sectioned side views of a portion of a strained channel semiconductor device such as a MOSFET 10 according to the prior art. FIG. 2 is taken along line 2—2 of FIG. 1.

MOSFET 10 comprises a generally planar semiconductor substrate 12, on which may be designated an array or matrix of substrate segments 14, only one of which is shown in FIGS. 1 and 2. The substrate 12 may be a body of bulk semiconductor or a layer of semiconductor on an insulative layer ("SOI"). Typically, the substrate 12 is silicon, though other semiconductors are contemplated.

A MOSFET 10 may be fabricated on and in each segment 14. Each MOSFET 10 includes a source 16 and a drain 18 formed in the semiconductor segment 14 on either side of a gate 20. The gate 20 comprises a gate dielectric 22 insulating a gate electrode 24 from the semiconductor segment 14 and from portions of the source 16 and the drain 18 that may extend under the gate 20.

An active area 26 of the semiconductor segment 14 is defined or delineated by the inner boundary 28 of an electrically insulative material 30 filling a shallow trench 32 that surrounds the active area 26. The combination of the trench 32 and the insulative material 30 is typically referred to as STI, or shallow trench isolation 30/32. Note that the depth of the "shallow" trench isolation can have a wide range, e.g., 0.3–1.0 $\mu$m in the current generation of 0.13 $\mu$m CMOS or bipolar technology, depending on the process etching capability and the level of electrical isolation needed.

The active area 26 has a length L between two opposed termini 34 and 36 that coincide with opposed portions of the inner boundary 28. The active area 26 also has a width W that is normal to the length L between two opposed sides 38 and 40 that coincide with opposed portions of the inner boundary 28. Thus, the active area 26 is defined by the product L*W and has a periphery made up of the termini 34, 36 and the sides 38, 40. Orthogonal X, Y axes are shown in FIG. 1. The length L of the active area 26 lies along the X-axis; the width W lies along the Y-axis.

Between the source 16 and the drain 18 in the segment 14 there is defined a channel 42 within the active area 26. Conduction selectively occurs or is prevented within the channel 42 and between the source 16 and the drain 18 depending on electrical signals applied to the gate electrode 24, as is well known.

The channel 42 has an effective channel length LE between the facing extremities of the source 16 and the drain 18, which is slightly shorter than the so-called "printed length" $L_P$, which is roughly equal to the physical length of the gate 20. The effective length LE lies along the X-axis. The width of the channel 42 is roughly equal to the width W of the active area 26 along the Y-axis. The direction of current flow in channel 42, evidenced by the movement of electrons and holes, between source 16 and drain 18 is generally along the X-axis or the effective length $L_E$ of the channel 42.

It is known that uni-axial mechanical tensile or compressive stress in the channel 42 along the X-axis, as well as the X component of bi-axial mechanical X,Y stress in the channel 42, increases or decreases the mobility of carriers, electrons and holes in the channel 42 and thereby also increases or decreases saturation velocity. Mechanical stress along or lengthwise of the channel 42 with desirable polarity (i.e., tensile or compressive) that increases carrier mobility in the channel 42 generally will increase the magnitude of the drive current of the MOSFET 10.

More specifically, it is known that producing or increasing tensile stress—or eliminating or reducing compressive stress—along the channel 42 increases electron mobility in n-MOS devices. Producing or increasing compressive stress—or eliminating or reducing tensile stress—along the channel 42 increases hole mobility in p-MOS devices.

It is also known that mechanical compressive stress along the Y-axis, across the channel 42, can retard or decrease the diffusion along the X-axis of deleterious impurities into the channel 42. Such impurities may be either an intended (e.g., by source and drain implantation), or an unintended but inherent, result of certain processing steps (e.g., metal atoms diffusing during silicide formation) associated with the fabrication of the MOSFET 10. Mechanical stress along the Y-axis and across or widthwise of the channel 42 does not appear to significantly affect carrier mobility along the channel 42 in the X-axis between the source 16 and the drain 18.

Even if the MOSFET 10 is fabricated without any attempt being made to generate or affect stress in the channel 42, a certain amount of residual mechanical stress nonetheless exists in the channel 42 due to the presence of the STI 30/32. For example, when fabricating the MOSFET 10 in a silicon substrate 10, the trench 32 may be filled with an insulative material 30 such as $SiO_2$ deposited by high-density plasma ("HDP") chemical vapor-deposition ("CVD"). Insulative material 30 deposited in this manner has a lower coefficient of thermal expansion than the segment 14 of the silicon substrate 12, resulting in residual bi-axial (X, Y) compressive stress in the active area 26. As the size of the active area 26 is reduced pursuant to current trends in CMOS technology, this residual compressive stress increases significantly. The compressive bi-axial stress typically is not symmetrical (e.g., may be higher in the X direction or along the length L of the channel 42 than in the Y direction along the width W of the channel 42 if the length L is smaller than the width W). The residual mechanical compressive stress also typically is not uniform in either direction (e.g., decreasing from the termini 34, 36 and the sides 38, 40 of the active area 26 towards its central regions).

If the STI 30/32 includes an insulative material 30 having a higher thermal expansion coefficient than the segment 14 of the substrate 12—or if the material 30 is porous and shrinks inward following fabrication of the MOSFET 10—the residual mechanical stress along and across the channel 42 is tensile. Other than being tensile, the foregoing comments regarding residual compressive stress in the channel apply. In the following embodiment, it will be assumed that the STI 30/32 includes material most popularly formed by the HDP CVD method and having a lower thermal expansion coefficient than the substrate, and that the residual stress in the active area is compressive.

Mechanical stress along the channel 42 can be intentionally increased or decreased in the X direction through the use of a highly stressed SiN ($Si_3N_4$) etch stop layer (not shown) that is typically applied atop the gate 20 and to other portions of the in-process MOSFET 10 in the course of forming electrical contacts (not shown) to the source 16 and the drain 18. The total stress along the channel 42 is then the result of superimposing the compressive or tensile component of the stress imposed by the SiN layer on the residual stress imposed by the STI 30/32.

It is known generally that if the SiN layer is formed by plasma-enhanced chemical-vapor deposition ("PECVD"), the stress component imposed by the layer on the channel 42 is compressive, which is added to and either increases or reduces the residual stress imposed by the STI 30/32 along the channel 42. If the SiN layer is formed by thermal chemical vapor deposition ("TCVD"), a tensile stress component is imposed along the channel 42 and is added to the STI 30/32-imposed residual stress along the channel 42.

Concerning the SiN layer, if the residual stress along the channel 42 is compressive and the SiN layer is formed by PECVD, the increase in compressive stress along the channel 42 will result in enhancement of hole mobility in p-MOS devices, but will degrade electron mobility in n-MOS devices. If the residual stress along the channel 42 is compressive and the SiN layer is formed by TCVD, the decrease in or elimination of compressive stress along the channel 42 enhances electron mobility in n-MOS devices but degrades hole mobility in p-MOS devices. Similarly, if the residual stress along the channel 42 due to the STI 30/32 is tensile, a PECVD SiN layer will reduce this tensile stress, while a TCVD SiN layer will increase the residual tensile stress.

Ion implantation of Ge into the SiN layer relaxes the stress in the layer, resulting in the addition of less stress, compressive or tensile, to the residual compressive stress along the channel 42. Implantation of Ge into only selected portions of the SiN layer results in its additive stress being applied only where desired.

Another technique for affecting the stress in the channel 42 selectively relates to the gate electrode 24. Typically, the gate electrode 24 is initially formed of CVD polysilicon. Thereafter, the polysilicon gate electrode 24 is subjected to Co (or Ti) siliciding to lower its sheet resistivity. If certain n-type dopants with relatively large atoms (compared to a silicon atom), such as As, are selectively implanted into the silicide of n-MOS gate 20, and the gate 20 is thereafter annealed with an $SiO_2$ cap layer thereon, the gate 20 is in tensile stress due to large As atoms in silicided poly-silicon gate 20, thus inducing or adding tensile stress to the residual stress along the channel 42 for higher electron mobility in n-MOS. Therefore, using such selective As implantation into an n-MOS gate only, the electron mobility in the n-MOS gate is enhanced, so as to not adversely affect hole mobility in a p-MOS.

While both the selective implantation of Ge into the SiN contact etch-stop layer and implantation of As into the silicided gate electrode 24 are compatible with typical CMOS processes, they involve complicated additional steps to MOSFET fabrication and add cost to the MOSFET 10.

SUMMARY OF THE INVENTION

Preferred embodiments of the present invention contemplate an improved strained channel semiconductor device, such as a MOSFET. The device is generally of the type that is fabricated in and on a semiconductor substrate. The device includes an active area that has a length delineated by two opposed termini or ends of the active area and a width that is delineated by two opposed sides of the active area. There is a channel in the active area. The channel lies between the two sides of, or across or along, the active area. There is residual stress in the active area and in the channel. The residual stress acts lengthwise of the active area and of the channel between the termini. The residual stress, which may be compressive or tensile, is produced by insulative material filling a trench, the inner boundary of the insulative material in the trench delineating the termini and the sides of the active area.

Preferred embodiments of the present invention contemplate selectively locally modifying, e.g., enhancing or reducing, stress in the channel 42—to selectively enhance electron and hole mobility in the channel 42—using uncomplicated layout techniques that do not require additional processing steps and that are compatible with standard CMOS fabrication processes.

In a preferred embodiment device such as a MOSFET, there is a deformation in a side of the active area. The deformation may be a depression into the side or a protrusion out of the side. The deformation of the active area side is outlined by an inward or outward deformation of the inner boundary of the insulative material and of the wall of the trench filled with the material. The deformation may generate additional compressive or tensile stress in the active area and in the channel. The deformation also generates additional compressive stress across, normal to, or widthwise of, the active area and the channel. The size, shape and location of the deformation may be selected to produce additional stress of selected magnitude, of selected location, and of selected profile in the active area and the channel.

In preferred embodiments, the deformation is entirely or partially over the channel and, if the device is a MOSFET or similar device, entirely or partially under a gate of the MOSFET that overlies the channel. The additional stress along the channel and the active area selectively modifies carrier mobility (e.g., enhances carrier mobility of one type and/or inhibits carrier mobility of the other type) in the channel. The additional stress across the channel retards diffusion thereinto of elements involved with doping (e.g., of a source/drain) and/or siliciding (e.g., of a gate electrode) the MOSFET.

Two or more deformations may be present to tailor and grade the stress and stress-affected carrier mobility in the active area. If there are two channels in the active area, two deformations in the same side of the active area may be formed to selectively shape and grade, either differently or similarly, the additional stress in selected areas of the active area and in the channels. Both deformations may add one type of stress in both channels, or one type of stress in one channel and the opposite type of stress in the other channel.

Two or more deformations may also be present in opposed sides of the channel. If two opposed and aligned deformations are present and both deformations add the same type of stress to the active area and the channel, they act to centralize the stress therein between the sides. If the opposed deformations are selectively misaligned widthwise of the channel, they act to locate the added stress in a selected location in the channel. If the two opposed deformations add different stress, they act to selectively tailor and grade the magnitude and type of the added stress and to locate it in a selected portion of the active area and the channel.

Multiple deformations may be present in both sides of the active area to produce alternate stress zones of one or the other type of stress along the active area, whereby each stress zone may be associated with one channel. The deformations may assume a variety of shapes to add varying components of stress at various locations.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The features of the present invention will be more clearly understood from consideration of the following descriptions in connection with accompanying drawings in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Although the present invention relates broadly to any strained channel semiconductor device, for convenience the following detailed description is drawn to a specific type of such a device, namely MOSFET 100. In the illustrated embodiments, a feature described as being a deformation, depression or protrusion of one of the sides 38 or 40 of the active area 26 generally refers to a feature primarily directed along the Y-axis.

Figure 1:
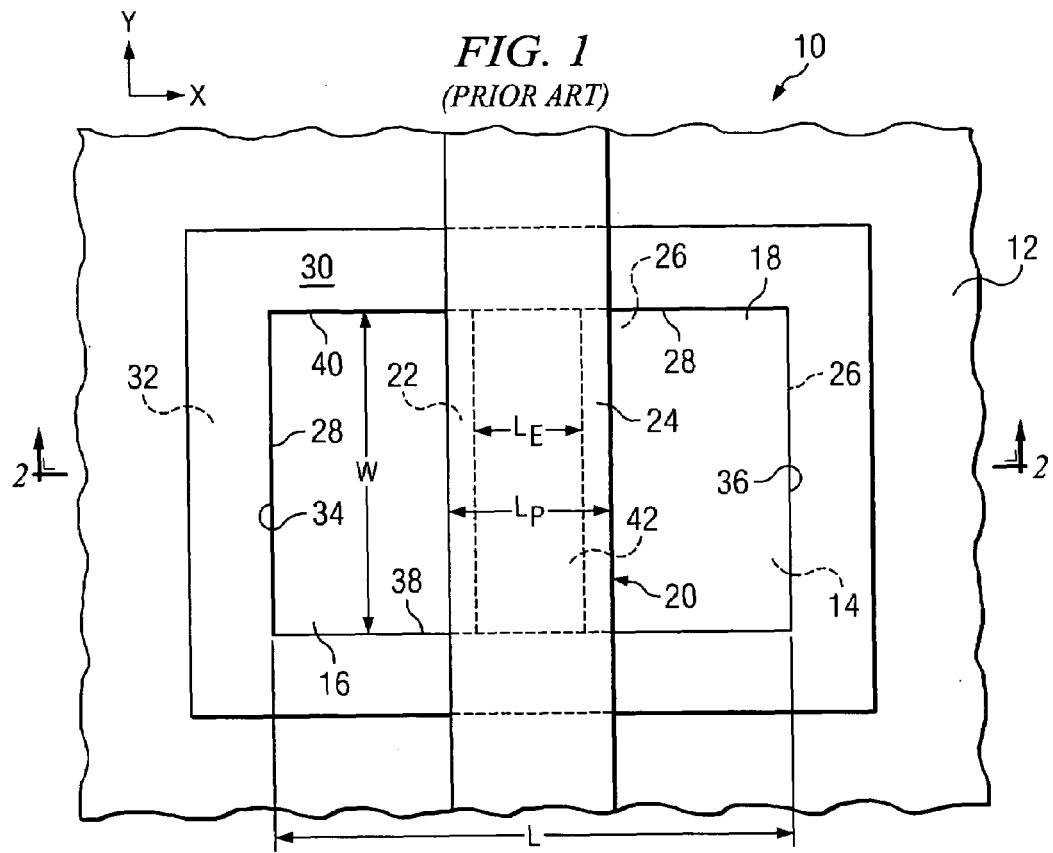
FIGS. 1 and 2 are, respectively, a top and a sectioned side view of a MOSFET configured and fabricated according to the prior art.
Figure 2:
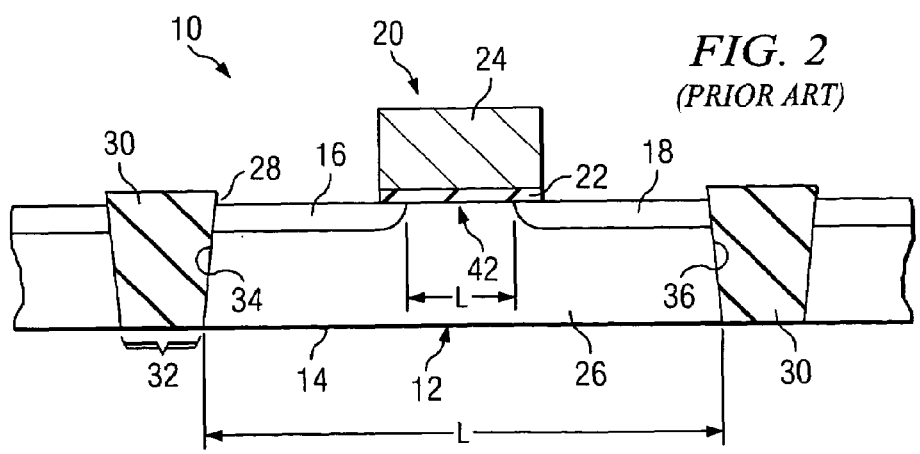

According to a preferred embodiment of the present invention, a MOSFET 100 is similar to that shown in FIG. 1, except that the configuration of the inner boundary 128 of the STI 130/132 and the side 140 (the side 140 portion of the periphery) of the active area 126 are modified. Assuming that (1) the substrate 12 is silicon (Si)—or some other semiconductor—either bulk or SOI, and the STI material 130 is $SiO^2$—deposited conventionally by high-density plasma chemical vapor deposition ("HDPCVD") with a lower coefficient of thermal expansion (e.g., about $5.0 \times 10^{-7}$ per degree C. or 0.5 ppm/° C.) than Si (e.g., about $2.0 \times 10^{-6}$ per degree C. or 2 ppm/° C.)—or another material having a thermal expansion coefficient lower than that of the substrate; then (2) even without implementing the present invention, due to assumption (1), the active area 126 and the channel 142 will be residually, bi-axially, compressively stressed in the X and Y directions by stress components $S_X$ and $S_Y$. One of ordinary skill in the art would understand, however, that the present invention is applicable to other semiconductor devices with other amounts and polarities of residual stresses.

Figure 3:
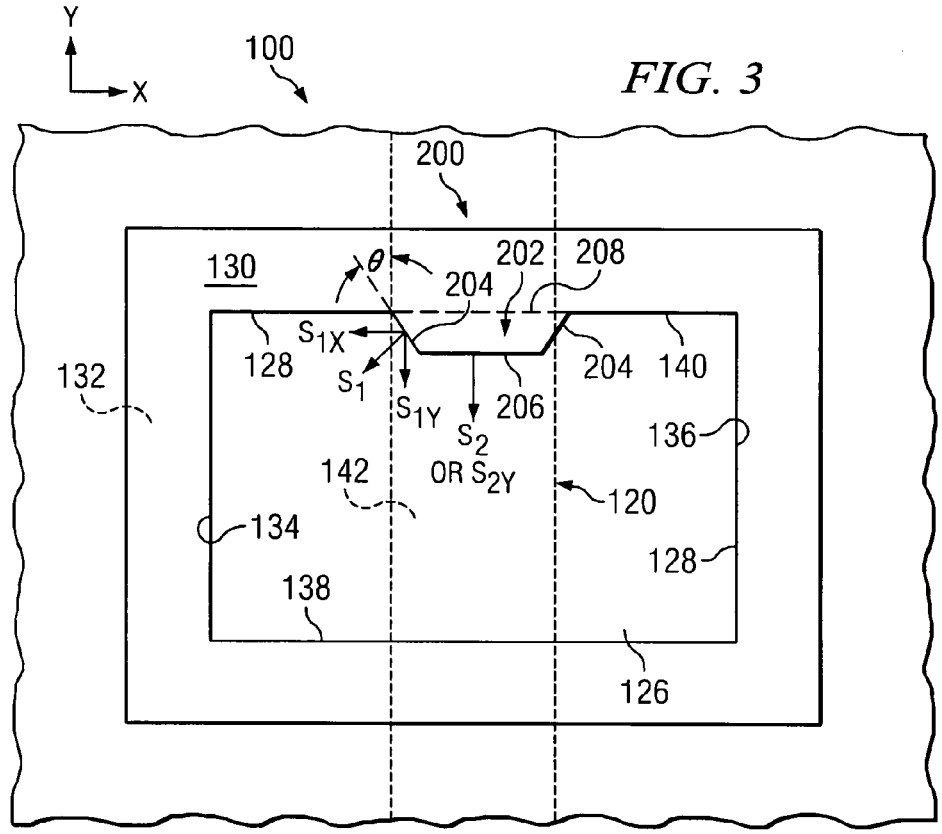
FIG. 3 is a top view of the active area of a MOSFET similar to FIG. 1, but rendered according to a first embodiment of the present invention in which the configuration of the active area as determined by the configuration of the STI is modified by layout techniques to enhance the mobility of carriers in the channel of the active area.

In FIG. 3, one side 140 of the active area 126 includes a deformation 200 configured as a regular trapezoidal depression 202 into the side 140. The configuration of the side 140 containing this depression 202 is determined by the complementary configuration of the inner boundary 128 of the STI 130/132 as such is formed during conventional fabrication steps. Note that the shape of both the side 140 of the active area and the inner boundary 128 of the STI generally is defined by the masking step of the active area and subsequent etching and $SiO_2$ filling for STI formation. The resultant stresses $S_1$ and $S_2$ produced as perpendicular to the boundary, respectively, by the sides 204 and "top" 206 of the depression 202 are directed as shown. The stress $S_1$ may be resolved into respective X- and Y-directed component stresses $S_{1X}$ and $S_{1Y}$. The stress $S_2$ is Y-directed and may be designated $S_{2Y}$.

The two component X stresses introduced by the deformation 200 are directed away from each other and generally form a tensile stress component opposite to the residual compressive stress component $S_X$, (i.e., the stress component with no deformation). Thus, by superposition, the total or net stress along X and along the active area 126 and the channel 142 adjacent to the deformation is the residual compressive stress $S_X$ less the added tensile stress $S_{1X}$. Generally, the deformation on side 140 does not alter the length L of the active area in the X-direction, and thus the principle of simple superposition of the X-direction components applies. If the latter quantity is less than $S_X$, the net stress along or lengthwise of the channel remains compressive, but is less than the residual compressive stress. If the latter quantity is greater than $S_X$, the net stress along the channel is tensile, not compressive.

The net stress in the Y-direction is derived in a similar fashion. The Y-direction stress components near sides 204 (i.e., $S_{1Y}$) and 206 (i.e., $S_{2Y}$) are generally compressive and in the same direction and additive to each other. The sum will generally be slightly larger than the residual $S_Y$ tensile stress (i.e., the residual stress with no deformation). Thus, the net stress across or widthwise of or normal to the channel 142 is generally compressive stress, that is, the combination of $S_{1Y}$ and $S_{2Y}$ less $S_Y$.

The magnitude and location of the added stress components $S_{1X}$ depends on the shape of the depression 202, on the size of the depression 202, and on the location of the depression 202 relative to the termini 134 and 136 of the active area 126. For example, the angle θ defined by the Y-axis and the sides 204 of the trapezoid 202 may be varied by varying the lengths of the top 206 and/or the "base" 208 of the trapezoid 202, while the length of the sides 204 remains constant. Similarly, θ may be varied by varying the depth D of the depression 202 (which determines the length of the sides 204) with the length of the top 206 and the base 208 remaining constant. Increasing θ decreases $S_{1X}$ and increases $S_{1Y}$. Decreasing θ increases $S_{1X}$ and decreases $S_{1Y}$. If the depression 202 is made larger, but is congruent with the shape illustrated, the magnitude of the stress components will be increased. Moving the depression 202 toward one or the other terminus 134 or 136 moves the location where the added stress is applied to the active area 126. As should be obvious, a myriad of different magnitudes and points of application for the added stress in the active area 126 and the channel 142 may be selected and achieved.

As noted earlier, if the net stress along the channel 142 is tensile, n-MOS electron mobility along the channel 142 will be enhanced, and hole mobility will be retarded. If the net stress along the channel 142 is compressive, p-MOS hole mobility along the channel 142 will be enhanced, while electron mobility will be retarded. In either event, however, compressive stress across or normal to the channel 142 will be increased to ameliorate or reduce diffusion of Co and dopants—such as LDD dopants used in forming the drain 18—into the channel 142. This may provide a significant advantage by alleviating the short-channel effect in advanced CMOS transistors.

Figure 4:
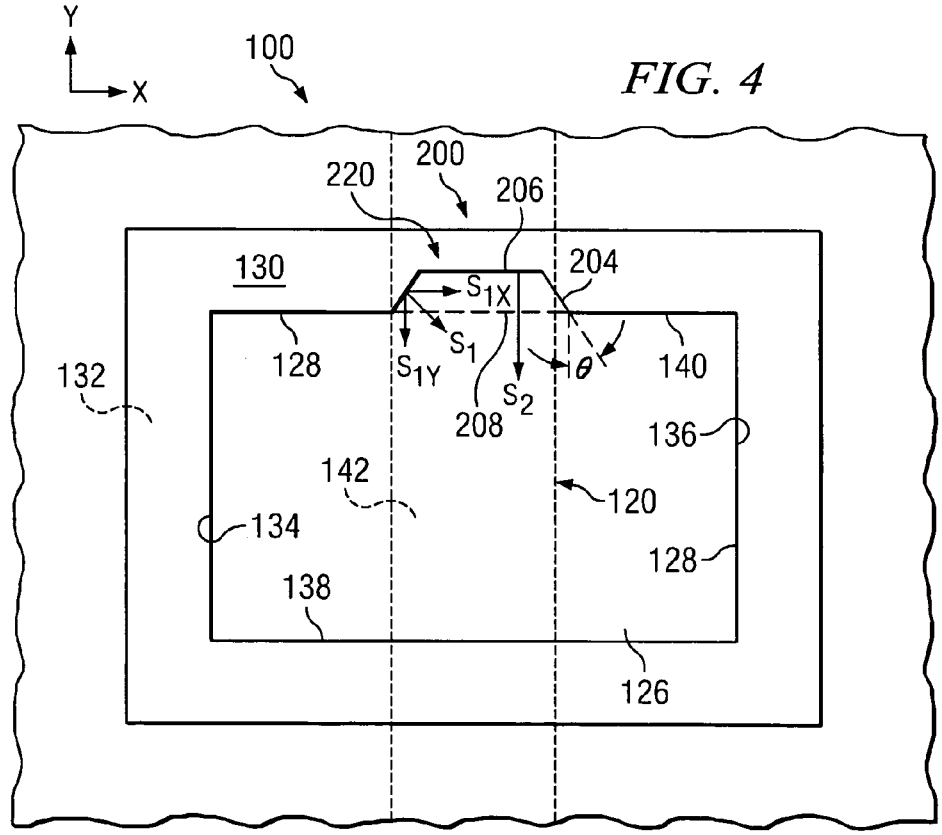
FIG. 4 is a top view of the active area of a MOSFET similar to FIG. 3, but in accordance with a second embodiment of the present invention.

FIG. 4 is similar to FIG. 3, except that the deformation 200 of the side 140 of the active area 126 is a trapezoidal protrusion 220 of the side 140 and inner boundary 128 of the STI 130/132. A resolution of the stresses added by the protrusion 204 to the residual compressive stress in the active area 126 determines that compressive stress is added in the X and Y directions. Thus, hole mobility along the channel 142 is enhanced (and electron mobility is retarded), and the anti-diffusion effects remain. Again, the added compressive stress may be modified by altering the size, shape and location of the protrusion 220.

While FIGS. 3 and 4 depict the STI 130/132 and the gate 20, these elements are, for simplicity, left out of FIGS. 5–11. Also, the Y components of the stress added by the variant deformations 200 of FIGS. 5–11 are not shown, as this stress generally is always compressive.

Figure 5:
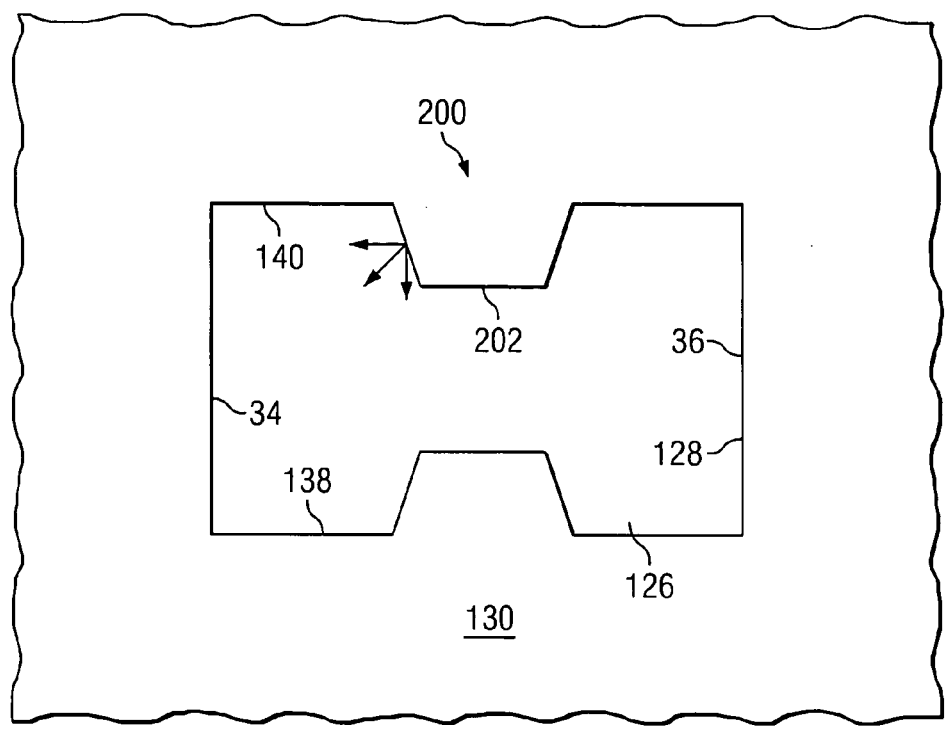
FIG. 5 is a top view of the active area of a MOSFET according to a third embodiment of the present invention, which is a modification of the embodiment depicted in FIG. 3.
Figure 6:
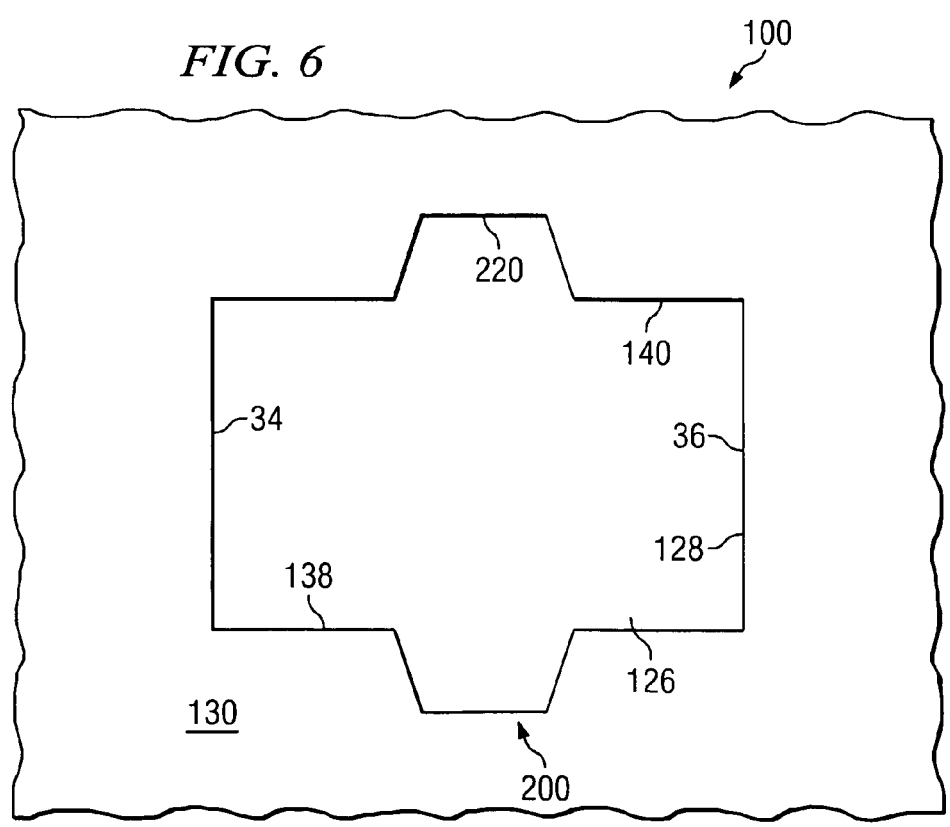
FIG. 6 is a top view of the active area of a MOSFET according to a fourth embodiment of the present invention, which is a modification of the embodiment shown in FIG. 4.
Figure 7A:
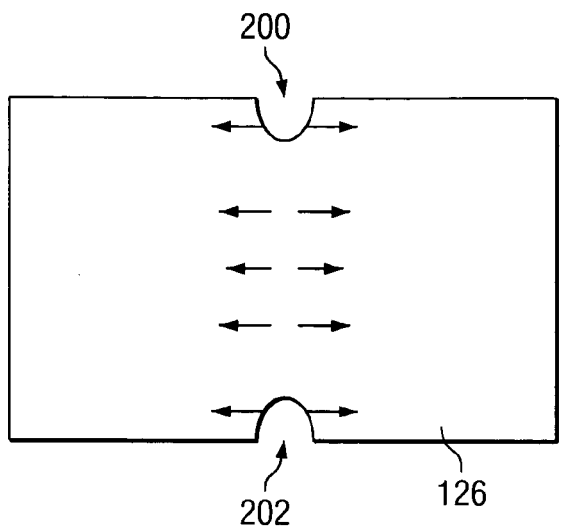
FIG. 7 contains partial top views of active area configurations that are alternatives to those shown in FIGS. 3 and 5.
Figure 7B:
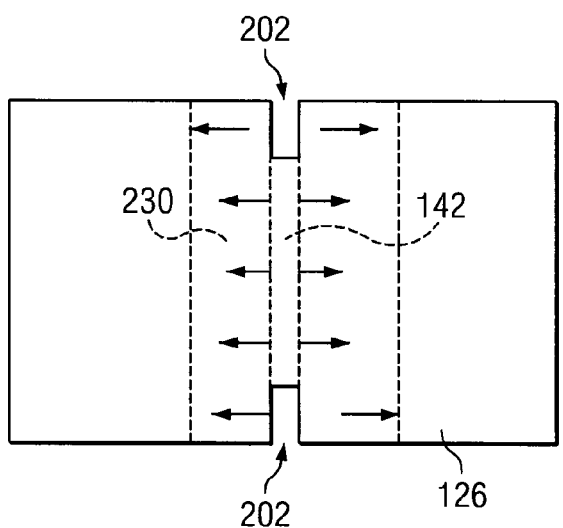
Figure 7C:
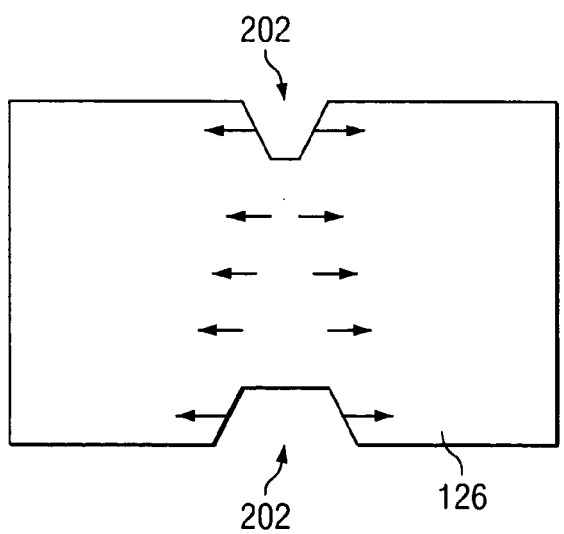
Figure 7D:
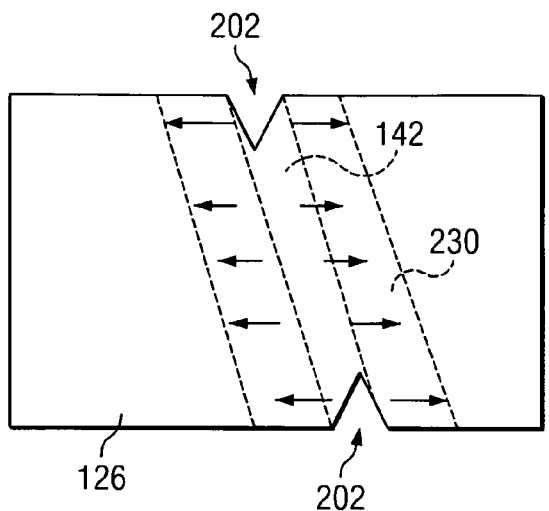
Figure 7E:
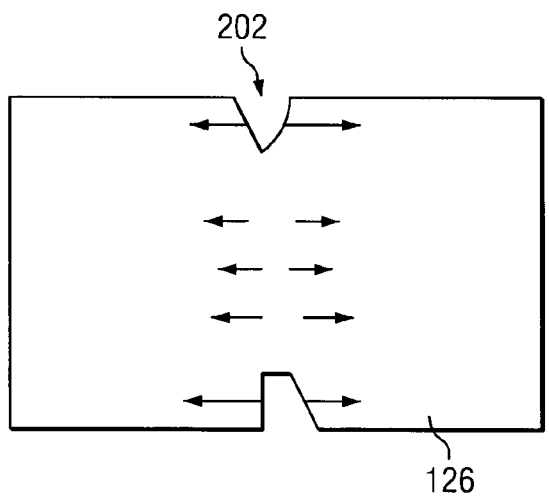
Figure 8A:
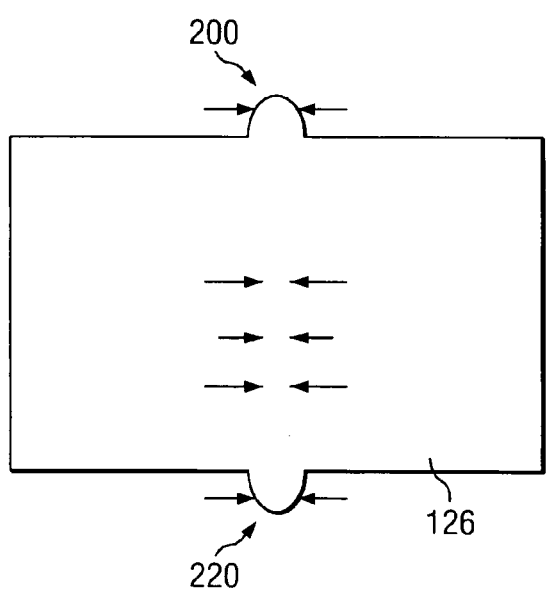
FIG. 8 contains partial top views of active area configurations that are alternatives to those depicted in FIGS. 4 and 6.
Figure 8B:
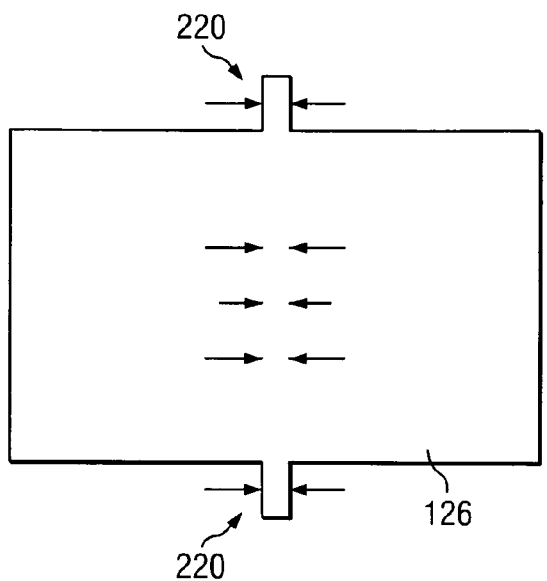
Figure 8C:
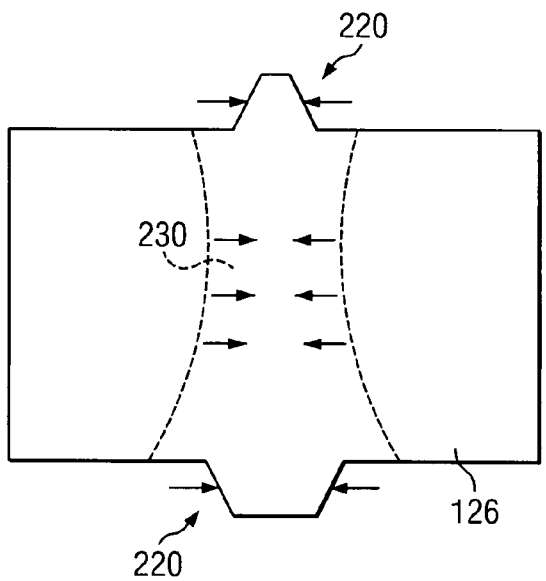
Figure 8D:
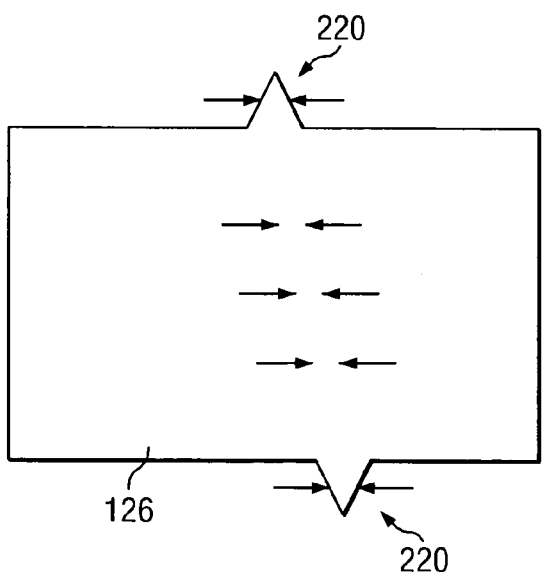
Figure 8E:
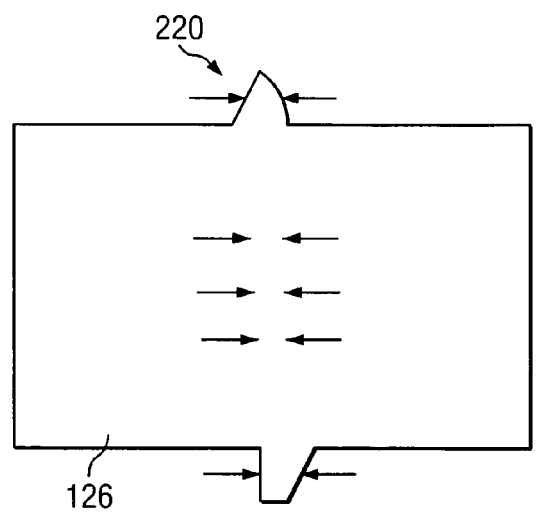

In FIG. 5, a deformation 200 is present in each side 138 and 140 of the active area 126. As depicted, the deformations 200 are trapezoidal depressions 200 that are symmetrically related to each other and to the termini 134 and 136 of the active area 126. It has been found that these depressions 202 generate additional tensile stress lengthwise of (along) and additional compressive stress widthwise of (across) the channel 126 more centrally in, and more symmetrically with respect to, the active area 126. FIG. 6 is similar to FIG. 5, except that the deformations 200 are trapezoidal protrusions 220 generating additional central, symmetrical compressive stress along and across the channel 126.

FIGS. 7 and 8 illustrate various other, but not all, possible shapes and locations of pairs of deformations 200. The added tensile stress (FIG. 7) and compressive stress (FIG. 8) achieved by these deformations, when the original assumption concerning the relative coefficients of expansion of the substrate 14 and the STI 130, 132, are schematically and approximately depicted by directed lines. Again, compressive stress across or normal to the channel 126 added by the deformations 200 is not shown. Relatively simple analyses of the stress components added to the residual stress by various possible configurations and locations of the deformations 200 will permit one skilled in the art to choose the shape, size and location thereof and of the inner edge 128 of the STI 130/132 along the sides 138 and 140 of the active area 126 to achieve desired stress in desired locations of the active area 126. As a general guideline, deformations 200 having straight sides angled 45° to the Y-axis and sizes proportional to the width of the channel 142 will generally be found relatively convenient to implement and to analyze.

Figure 9:
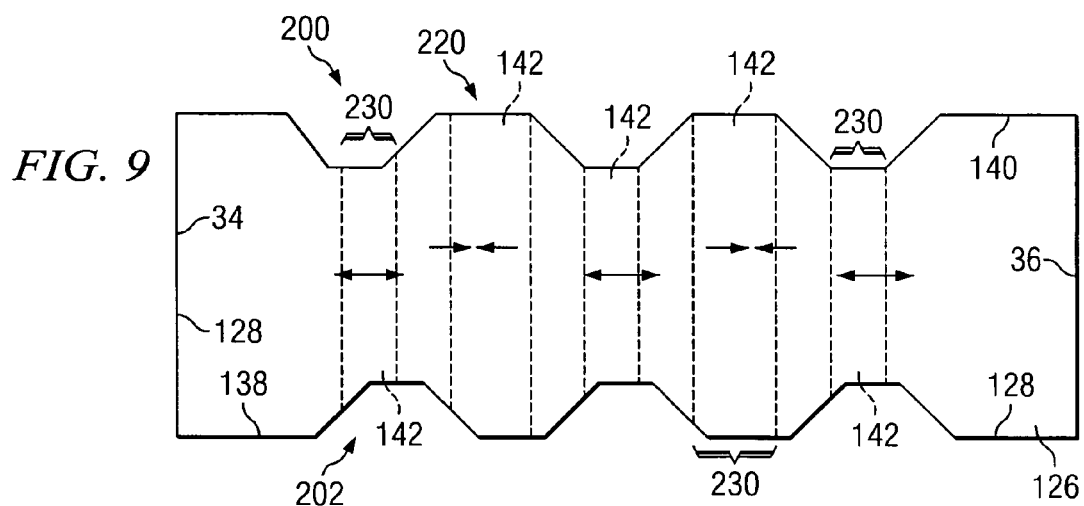
FIG. 9 is a top view of a multi-channel active area of a MOSFET in which the embodiments of FIGS. 5 and 6 are combined to enhance the mobility of carriers in the channels of the active area by different amounts in the different channels.

In FIG. 9, deformations 200 of both types—depressions 202 and protrusions 220—are present in the sides 138 and 140 of the active area 126 and in the complementary inner boundary 138 of the STI 130/132. The deformations 200 are periodically arrayed so as to generate alternating, periodically added compressive and tensile stress zones 230 along multiple channels 142. Preferably, though not necessarily, the embodiment of FIG. 9 centralizes the added stress under the respective gate (not shown in FIG. 9) that overlies each channel 142. The same is, of course, true of embodiments depicted in other figures.

Figure 10:
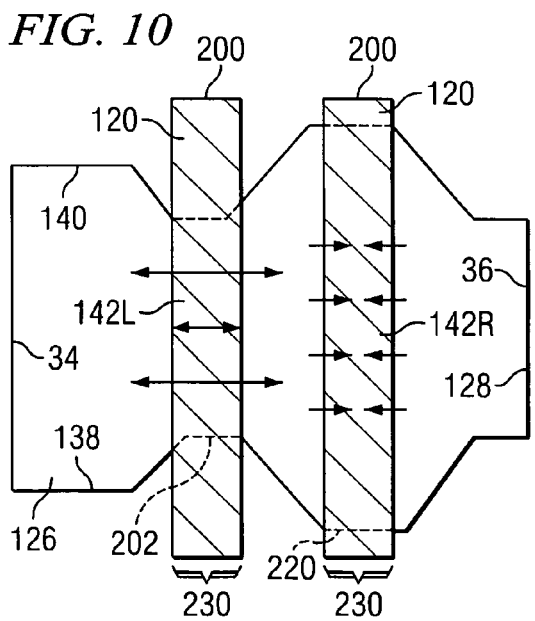
FIG. 10 is a top view of a two-channel active area of a MOSFET in which the embodiments of FIGS. 5 and 6 are combined to enhance carrier mobility in the channels by different amounts.

In FIG. 10, the deformations 200 comprise a pair of aligned trapezoidal depressions 202 and a pair of adjacent, aligned trapezoidal protrusions 220. One stressed channel 142L is defined across the active area 126 between the tops of the trapezoidal depressions 202; the other stressed channel 142R is defined between the tops of the trapezoidal protrusions 220. Each channel 142L and 142R is overlain by its gate 120. Tensile stress is added along the channel 126 between the depressions 202, while compressive stress is added along the channel 126 between the protrusions 220. Accordingly, in the former channel 126, electron mobility is enhanced; in the latter channel 126, hole mobility is enhanced.

Figure 11:
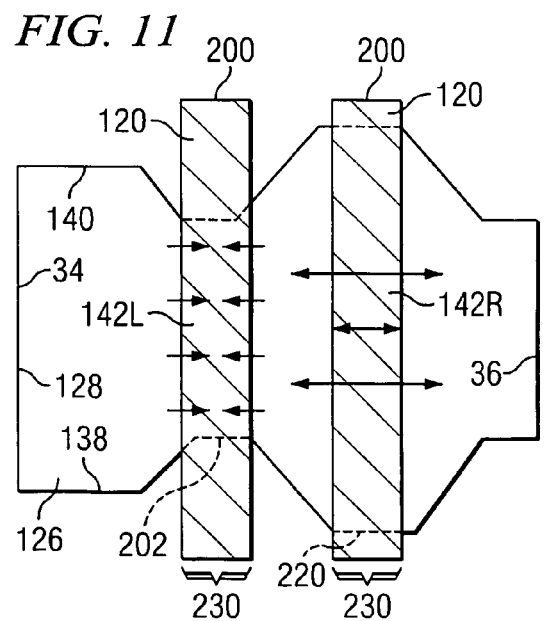
FIG. 11 is a top view of a two-channel active area of a MOSFET that is alternative to the embodiment of FIG. 10.

FIG. 11 is similar to FIG. 10, except that, contrary to the original assumptions, the coefficient of thermal expansion of the STI 130/132 is greater than that of the substrate 14. This results in the residual stress along the active area 126 and the channels 142 being tensile rather than compressive. The residual stress across or normal to the channels 142 is, therefore, also tensile. As a consequence, the same configuration of deformations 200 as shown in FIG. 10 produces added compressive stress for the left-hand channel 142L and added tensile stress for the right-hand channel 142R. This reversal in the effect of the deformations 200 holds true for the embodiments shown in other figures hereof. Also note that, in the case of FIG. 11 with tensile stress in the active area, either the depression or protrusion adds to greater tensile stress normal to the channels 142. As a result, the Co and LDD dopant diffusions are accelerated and result in shorter effective channel length.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A strained channel semiconductor device comprising:
an active area having a length delineated by two opposed termini and a width delineated by two opposed sides;
a channel in the active area between the sides thereof, wherein the active area and the channel comprise a residual lengthwise stress; and
a first deformation in one side of the active area for selectively enhancing or reducing the residual lengthwise stress in the channel by producing additional lengthwise tensile or compressive force in the active area.

2. The strained channel semiconductor device of claim 1, wherein the selective enhancement or reduction of the residual lengthwise stress in the channel selectively affects carrier mobility therein.

3. The strained channel semiconductor device of claim 1, wherein there is also residual widthwise compressive stress in the active area and the channel, and wherein the first deformation selectively enhances the residual widthwise stress in the channel by producing additional widthwise compressive force in the active area.

4. The strained channel semiconductor device of claim 3, wherein the selective enhancement of the widthwise compressive stress in the channel retards diffusion into the channel of elements used in doping and siliciding the strained channel semiconductor device.

5. The strained channel semiconductor device of claim 3, wherein a shape of the first deformation is selected to produce additional widthwise compressive stress in the active area and in the channel.

6. The strained channel semiconductor device of claim 1, wherein a shape of the first deformation is selected to produce additional lengthwise tensile or compressive stress in the active area and in the channel.

7. The strained channel semiconductor device of claim 1, wherein the first deformation is a depression in the one side of the active area and the additional lengthwise force is tensile.

8. The strained channel semiconductor device of claim 1, wherein the first deformation is an outward protrusion of the one side of the active area and the additional lengthwise force is compressive.

9. The strained channel semiconductor device of claim 1, further comprising a second deformation in the other side of the active area for selectively further enhancing or decreasing the lengthwise stress in the channel by producing additional lengthwise tensile or compressive force in the active area.

10. The strained channel semiconductor device of claim 9, wherein both deformations are depressions in their respective sides and the additional lengthwise force in the active area is tensile.

11. The strained channel semiconductor device of claim 9, wherein both deformations are protrusions of their respective sides and the additional lengthwise force in the active area is compressive.

12. The strained channel semiconductor device of claim 1, further comprising a second deformation in the one side of the active area and being spaced lengthwise from the first deformation for selectively further enhancing the lengthwise tensile or compressive force in the active area by selectively producing additional lengthwise compressive or tensile force in the active area.

13. The strained channel semiconductor device of claim 12, wherein the first and second deformations are depressions in the one side of the active area and delineate therebetween a third deformation that is a protrusion of the one side of the active area, the first and second deformations producing additional tensile force lengthwise of the channel, the third deformation producing additional compressive force lengthwise of the channel, and all of the deformations producing additional compressive force widthwise of the channel.

14. The strained channel semiconductor device of claim 12, wherein the first and second deformations are protrusions of the one side of the active area and delineate therebetween a third deformation that is a depression in the one side of the active area, the first and second deformations producing additional compressive force lengthwise of the channel, the third deformation producing additional tensile force lengthwise of the channel, and all of the deformations producing additional compressive force widthwise of the channel.

15. The strained channel semiconductor device of claim 12, further comprising third and fourth deformations in the other side of the active area that are selectively aligned or misaligned with the first and second deformations in the one side of the active area for further selectively producing tensile or compressive force lengthwise of the channel and for producing additional compressive force widthwise of the channel.

16. The strained channel semiconductor device of claim 15, wherein the spacing between the first and second deformations and the spacing between the third and fourth deformations and the positions of the first and second deformations relative to the positions of the third and fourth deformations lengthwise of the channel are selected to produce selected stress in one or more selected locations of the channel.

17. A method of selectively enhancing or reducing carrier mobility in a strained channel semiconductor device, said method comprising:
forming an active area having a length delineated by two opposed termini and a width delineated by two opposed sides;
forming a channel in the active area between the sides thereof, wherein the active area and the channel comprise a residual lengthwise stress; and
forming a first deformation in one side of the active area to selectively enhance or reduce the lengthwise stress in the channel by producing additional lengthwise tensile or compressive force in the active area.

18. The method of claim 17, wherein the active area and the channel comprise a residual widthwise compressive stress, and wherein the first deformation selectively enhances the widthwise stress in the channel by producing additional widthwise compressive force in the active area.

19. The method of claim 18, wherein the selective enhancement of the widthwise compressive stress in the channel retards diffusion into the channel of elements used in doping and siliciding the strained channel semiconductor device.

20. The method of claim 17, wherein the shape of the first deformation is selected to produce selected additional lengthwise tensile or compressive stress in the active area and in the channel.

21. The method of claim 17, wherein the shape of the first deformation is selected to produce selected additional widthwise compressive stress in the active area and in the channel.

22. The method of claim 17, wherein the first deformation is a depression in the one side of the active area and the additional lengthwise stress is tensile.

23. The method of claim 17, wherein the first deformation is an outward protrusion of the one side of the active area and the additional lengthwise stress is compressive.

24. The method of claim 17, further comprising forming a second deformation in the other side of the active area to selectively further enhance or decrease the lengthwise stress in the channel by producing additional lengthwise tensile or compressive force in the active area.

25. The method of claim 24, wherein both deformations are depressions in their respective sides and the additional lengthwise force in the channel is tensile.

26. The method of claim 24, wherein both deformations are protrusions of their respective sides and the additional lengthwise force in the channel is compressive.

27. The method of claim 17, further comprising forming a second deformation in the one side of the active area, the second deformation being spaced lengthwise from the first deformation, to selectively further enhance the lengthwise tensile or compressive force in the channel by selectively producing additional lengthwise tensile or compressive force in the active area.

28. The method of claim 27, wherein the first and second deformations are depressions in the one side of the active area and delineate therebetween a third deformation that is a protrusion of the one side of the active area, the first and second deformations producing additional tensile force lengthwise of the channel, the third deformation producing additional compressive force lengthwise of the channel, and all of the deformations producing additional compressive force widthwise of the channel.

29. The method of claim 27, wherein the first and second deformations are protrusions of the one side of the active area and delineate therebetween a third deformation that is a depression in the one side of the active area, the first and second deformations producing additional compressive force lengthwise of the channel, the third deformation producing additional tensile force lengthwise of the channel, and all of the deformations producing additional compressive force widthwise of the channel.

30. The method of claim 27, further comprising forming in the other side of the active area third and fourth deformations that are spaced apart lengthwise of the channel to selectively produce additional tensile or compressive force lengthwise of the channel and to produce additional compressive force widthwise of the channel.

31. The method of claim 30, further comprising selecting the spacing between the first and second deformations and the spacing between the third and fourth deformations and selecting the positions of the first and second deformations relative to the positions of the third and fourth deformations lengthwise of the channel to produce selected stress in one or more selected locations of the channel.

32. A method of selectively enhancing or reducing carrier mobility in each of several zones of a channel disposed in an active area of a strained channel semiconductor device fabricated in and on a generally planar semiconductor segment, the method comprising:

forming the active area having a length delineated by two opposed termini and a width delineated by two opposed sides;

forming the channel in the active area between the sides thereof, wherein the active area and the channel comprise a residual lengthwise stress, wherein the zones lie lengthwise of the channel between the sides; and forming one or more deformations in one or more of the sides of the active area to selectively enhance or reduce the lengthwise stress in selected zones of the channel by producing additional lengthwise tensile or compressive force in the respective zones.

\* \* \* \* \*